United States Patent [19]

Butt

[11] Patent Number: 4,461,924
[45] Date of Patent: Jul. 24, 1984

[54] SEMICONDUCTOR CASING
[75] Inventor: Sheldon H. Butt, Godfrey, Ill.
[73] Assignee: Olin Corporation, New Haven, Conn.
[21] Appl. No.: 341,392
[22] Filed: Jan. 21, 1982
[51] Int. Cl.³ .............................................. H05K 5/00
[52] U.S. Cl. ................................ 174/52 FP; 29/827; 357/74
[58] Field of Search ................. 174/52 FP; 428/418; 29/827; 357/74

[56] References Cited
U.S. PATENT DOCUMENTS

| | | |
|---|---|---|
| 2,999,194 | 3/1957 | Boswell et al. |
| 3,113,252 | 2/1958 | Matea |
| 3,341,369 | 9/1967 | Caule et al. |
| 3,676,059 | 7/1972 | Thompson |
| 3,676,292 | 7/1972 | Pryor et al. |
| 3,676,748 | 7/1972 | Kobayashi et al. |
| 3,684,818 | 8/1972 | Netherwood |
| 3,714,370 | 1/1973 | Nixen et al. |
| 3,726,987 | 4/1973 | Pryor et al. ............... 174/50.61 |
| 3,740,920 | 6/1973 | Lane |
| 3,762,039 | 10/1973 | Douglass et al. |
| 3,801,728 | 4/1974 | Gallo, Jr. et al. |
| 3,826,629 | 7/1974 | Pryor et al. ............... 428/626 X |
| 3,914,858 | 10/1975 | Sonoda et al. |
| 3,988,825 | 11/1976 | Fuchs et al. |
| 4,105,861 | 8/1978 | Hascoe .......................... 174/52 FP |
| 4,204,247 | 5/1980 | Wigley .......................... 174/52 PE |

OTHER PUBLICATIONS

F. Neighbour and B. R. White, "Factors Governing Aluminum Interconnection Corrosion in Plastic Encapsulated Microelectronic Devices", *Microelectronics and Reliability*, Pergamon Press, Great Britain, vol. 16, 1977, pp. 161–164.
R. C. Olberg and J. L. Bozarth, "Factors Contributing to the Corrosion of the Aluminum Metal on Semiconductor Devices Packaged in Plastics", *Microelectronics and Reliability*, Pergamon Press, Great Britain, vol. 15, 1976, pp. 601–611.

Primary Examiner—J. V. Truhe
Assistant Examiner—D. A. Tone
Attorney, Agent, or Firm—Howard M. Cohn; Paul Weinstein; Barry L. Kelmachter

[57] ABSTRACT

A casing for an electrical component comprises a metal base member. A metal housing member is mounted on the base member to provide a hollow enclosed casing for receiving the electrical component. A metal lead frame is provided within the enclosed casing and is electrically connected to the electrical component. The lead frame has terminal leads projecting between the base member and the housing member external to the casing. The improvement comprises an adhesive for sealing and bonding the terminal leads to both the base member and to the housing member to form the enclosed casing.

14 Claims, 1 Drawing Figure

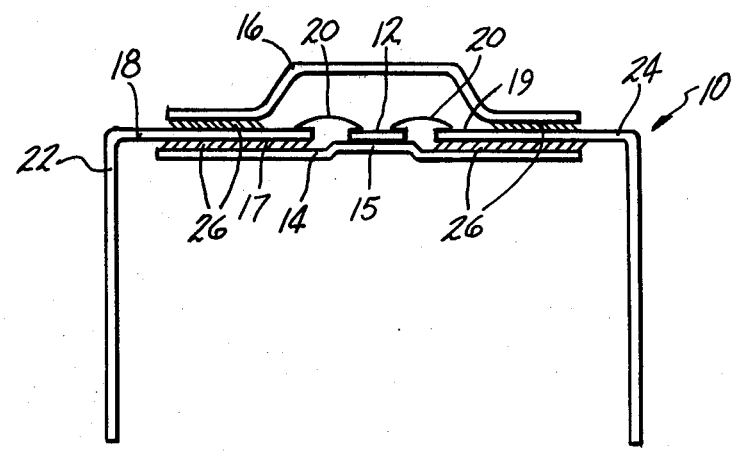

SEMICONDUCTOR CASING

The present invention is to a process and apparatus for encasing a semiconductor and more particularly for providing a highly reliable metal casing which is sealed and bonded using an adhesive.

Presently, in the electronic industry there are basically two types of semiconductor packages used for most integrated circuits. One is the plastic molded package in which an electronic device, supported on a lead frame, is molded into an encapsulating plastic. This plastic package has several reliability problems. Firstly, failures in the plastic to metal bond provide an avenue through which moisture and other contaminants can reach the electric device and cause corrosion failures. This problem has been more fully explained and documented in an article entitled "Factors Governing Aluminum Interconnection Corrosion in Plastic Encapsulated Microelectronic Devices" by Neighbour and White, published in *Microelectronics and Reliability*, by Pergamon Press in Great Britain, Vol. 16, 1977, pages 161–164.

Even when such failures do not occur, diffusion of contaminants through the plastic or perhaps arising as a result of gradual degradation of the plastic may cause failure. This type of failure has been described in an article entitled "Factors Contributing to the Corrosion of the Aluminum Metal on Semiconductor Devices Packaged in Plastics" by Olberg and Bozarth, published in *Microelectronics and Reliability*, by Pergamon Press in Great Britain, Vol. 15, 1976, pages 601–611.

In another type of package, two pieces of alumina ceramic are glass sealed to the lead frame with a suitable solder glass to form a hermetic ceramic dual in-line package (CERDIP). The CERDIP package avoids the problems associated with the plastic molded package. However, it is much more costly.

Another technique known in the art is to enclose a semiconductor device in a metal package and to hermetically seal the package using cold pressure welding. This method of hermetically sealing an electrical component in a metal housing is taught in U.S. Pat. Nos. 2,999,194 to Boswell et al. and in U.S. Pat. No. 3,988,825 to Fuchs et al.

It is also known in the prior art to provide a hermetically sealed enclosure for an electronic device which is fabricated without the use of heat. This concept has been disclosed in U.S. Pat. No. 3,113,252 to Matea.

It is a problem underlying the present invention to provide a package for an electrical component which has high reliability without the cost associated with completely hermetically sealed packages.

It is an advantage of the present invention to provide a casing for an electrical component which obviates one or more of the limitations and disadvantages of the described prior arrangements.

It is a further advantage of the present invention to provide a casing for an electrical component which is substantially resistant to the diffusion of contaminants.

It is a yet further advantage of the present invention to provide a casing for an electrical component which is relatively inexpensive to manufacture.

It is a still yet further advantage of the present invention to provide a casing for an electrical component which may be assembled without the use of heat.

Accordingly, there has been provided a casing for an electrical component comprising a metal base member. A metal housing member is mounted on the base member to provide a hollow enclosed casing for receiving the electrical component. A metal lead frame is provided within the enclosed casing and is electrically connected to the electrical component. The lead frame has permanent leads projecting between the base member and the housing member external to the casing. The improvement comprises an adhesive for sealing and bonding the terminal leads to both the base member and to the housing member to form the enclosed casing.

The invention and further developments of the invention are now elucidated by means of the preferred embodiment shown in the drawing:

The FIGURE is a cross section of a casing for an electrical component in accordance with the present invention.

Referring to the FIGURE, there is illustrated a casing 10 for an electrical component 12. The casing comprises a metal base member 14. A metal housing member 16 is mounted upon the base member 14 to provide a hollow enclosed casing for receiving the electrical component. A metal lead frame 18 within the enclosed casing is electrically connected by wires 20 to the electrical component. The lead frame 18 has terminal leads 22 and 24 projecting between the base member 14 and the housing member 16 external to the casing 10. The improvement comprises an adhesive 26 for sealing and bonding the terminal leads to both the base member and to the housing member to form the enclosed casing.

The package for sealing an electrical component such as a semi-conductor element comprises a metal base member 14 of any desired shape and thickness. The semi-conductor element or chip 12 is mounted on a recessed section 15 the bottom member using an epoxy adhesive bond as in any conventional plastic encapsulated package. The bottom surface 17 of lead frame 18 is sealed and bonded to the bottom member 14 using an epoxy adhesive 26. An electrical connection between the chip 12 and the lead frame is made by wires 20 in a conventional manner. Then, the housing member 16 is sealed and bonded to the top surface 19 of the lead frame using epoxy 26. As seen in the figure, the terminal leads 22 and 24 project between the base member and the housing member external to the casing 10. Although the terminal leads preferably protrude from all sides of the casing, it is within the scope of the present invention for the terminal leads to extend from any number of sides. In that instance, there may be surface areas between the housing member 10 and base member 14 which are in contact with each other. Then, the adhesive would be provided between these surface areas to bond and seal them together. The housing member may be shaped to form a hollow enclosure as shown so as to not interfere with the chip or electrical wires 20. However, the exact shape of the casing 10 does not form a part of the present invention and may be any shape as desired.

In the preferred embodiment, the top surface of the chip or electrical component 12 is disposed substantially coplanar with the top surface 19 of the lead frame 18. The positioning of the chip into this arrangement may be accomplished by providing a recessed section 15 in the base member 14. The chip then is disposed on the recessed section so that the top surface of the electrical component is in the substantially coplanar arrangement with the top surface of the lead frame.

The metal used for the base member, the housing member, and the lead frame may be of any desired metal or alloy which bonds strongly with epoxy. However, in accordance with this invention, it has been found that copper and copper base alloys having a refractory oxide layer provide very strong bonds with epoxy and thereby prevent diffusion of contaminants between the epoxy and the metal substrate. Suitable copper base alloys for use in the present invention contain from 2 to 12% aluminium. In particular, CDA alloy 638 containing 2.5 to 3.1% aluminum, 1.5 to 2.1% silicon, and 0.25 to 0.55% cobalt is most useful in the provision of a metal in accordance with this invention. Impurities may be present which do not prevent bonding in a desired environment.

The alloys useful with this invention and, especially alloy 638, have a refractory oxide layer applied to the surface which is in contact with the adhesive. The oxide layer may include complex oxides formed with elements such as alumina, silica, tin, iron chromia, zinc, and manganese. Most preferably, the refractory oxide layer is substantially aluminium oxide ($Al_2O_3$). This refractory oxide may be applied to the substrate in any desired manner. For example, a copper base alloy such as alloy 638 is preoxidized in gases having an extremely low oxygen content. The 638 may be placed in a container with 4% hydrogen and 96% nitrogen and a trace of oxygen released from a trace of water mixed in the gas. This gas may be heated to a temperature of between about 330° C. and about 820° C. Depending on the temperature and amount of time the alloy is left in the heated gas, a refractory oxide layer of a desired thickness forms on the surface of the alloy. It is also within the scope of the invention to apply the refractory oxide layer to the entire surface of each element in contact with the epoxy.

The advantage of using alloy 638 with a preoxidized surface is that it bonds well to epoxies and is, therefore, substantially impervious to the diffusion of contaminants between the epoxy and the metal substrate. Also, the preoxidized surface is an excellent barrier to any contaminants passing directly through the metal. Thus, the casing of the present invention has reduced the potential for interdiffusion of contaminants since the majority of the package is metal and the interdiffusion can substantially only occur in the relatively thin layer of adhesive which seals the package.

The present invention uses any adhesive 26 such as an epoxy which provides a strong bond with the metal and preferably the preoxidized surface of 638.

It is apparent that there has been provided in accordance with this invention a casing for an electrical component and a method of forming the component which fully satisfies the objects, means, and advantages set forth hereinabove. While the invention has been described in combination with the specific embodiment thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

I claim:

1. In a casing adapted to house an electrical component, comprising:
   a metal base member;
   a metal housing member being mounted upon said base member to provide a hollow enclosed casing for receiving said electrical component;
   a metal lead frame within said enclosed casing for electrical connection to said electrical component, said lead frame having terminal leads projecting between said base member and said housing member external to said casing, the improvement comprising:
   said metal base member, metal lead frame and metal housing member each having a thin refractory oxide layer on their surfaces; and
   an epoxy between the thin refractory oxide layers for sealing and bonding said lead frame between said base member and said housing member whereby said enclosed casing is formed.

2. An article as in claim 1 wherein said metal base member, metal lead frame and metal housing member are copper or a copper base alloy.

3. An article as in claim 2 wherein said copper base alloy comprises 2 to 12% aluminum and the balance essentially copper.

4. An article as in claim 3 wherein said copper base alloy consists essentially of 2.5 to 3.1% aluminum, 1.5 to 2.1% silicon, 0.25 to 0.55% cobalt, and the balance essentially copper.

5. An article as in claim 4 wherein said refractory oxide layer includes $Al_2O_3$.

6. An article as in claim 1 wherein the bottom surface of said electrical component is bonded to said base member, said lead frame is disposed adjacent said electrical component whereby the top surface of said lead frame is substantially coplanar with the top surface of said electrical component.

7. An article as in claim 6 further including a recessed section of said metal base member to which said electrical component is bonded whereby said electrical component in disposed in the coplanar arrangement.

8. The method of forming a casing adapted to house an electrical component, comprising the steps of:
   providing a metal base member;
   providing a metal housing member;
   mounting said metal housing member upon said base member to provide a hollow enclosed casing for receiving said electrical component;
   providing a metal lead frame;
   disposing said metal lead frame within said enclosed casing so as to project between said base member and said housing member external to said casing;
   the improvement comprising:
   forming a refractory oxide layer on the surfaces of said metal base member, metal housing member and metal lead frame; and
   applying an epoxy between said refractory oxide layers to seal and bond said lead frame to both said base member and to said housing member for forming said enclosed casing.

9. The method as in claim 8 wherein said steps of providing said metal base member, metal housing member and metal lead frame include providing the metal from a copper or copper base alloy.

10. The method as in claim 9 wherein said copper base alloy comprises 2 to 12% aluminum and the balance essentially copper.

11. The method as in claim 10 wherein said copper base alloy consists essentially of 2.5 to 3.1% aluminum, 1.5 to 2.1% silicon, 0.25 to 0.55% cobalt, and the balance essentially copper.

12. The method as in claim 11 wherein said refractory oxide layer includes $Al_2O_3$.

13. The method as in claim 8 including the step of disposing the lead frame adjacent the electrical component whereby the top surface of said lead frame is substantially coplanar with the top surface of said electrical component.

14. The method as in claim 8 further including the steps of providing a recessed section in said metal base member; and bonding said electrical component to said recessed section whereby said electrical component is disposed in the coplanar arrangement with the top surface of said lead frame.

* * * * *